(12) United States Patent
Chang

(10) Patent No.: US 7,238,045 B1
(45) Date of Patent: Jul. 3, 2007

(54) BATTERY-SECURING STRUCTURE WITH SETTING-CLEARED ELEMENTS

(75) Inventor: Ya-Han Chang, Keelung (TW)

(73) Assignee: Giga-Byte Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 11/307,069

(22) Filed: Jan. 23, 2006

(51) Int. Cl.
*H01R 3/00* (2006.01)

(52) U.S. Cl. .................................... 439/500

(58) Field of Classification Search ............... 439/500, 439/504, 73, 627, 754, 759, 775; 361/760, 361/761
See application file for complete search history.

(56) References Cited

U.S. PATENT DOCUMENTS

| | | | |
|---|---|---|---|
| 4,251,604 A | | 2/1981 | Umemoto |
| 4,653,822 A | * | 3/1987 | Kanazawa ................. 439/68 |
| 4,972,135 A | * | 11/1990 | Bates et al. ................ 320/105 |
| 4,998,888 A | * | 3/1991 | Link et al. .................. 439/73 |
| 5,276,354 A | | 1/1994 | Link et al. |
| 5,612,659 A | * | 3/1997 | Kerber ...................... 335/177 |
| 5,805,423 A | * | 9/1998 | Wever et al. ............... 361/760 |
| 5,931,693 A | * | 8/1999 | Yamazaki ................... 439/500 |
| 5,980,309 A | * | 11/1999 | Frantz et al. ............... 439/500 |
| 5,993,248 A | * | 11/1999 | Bethurum ................... 439/500 |
| 6,293,819 B1 | | 9/2001 | Wu ............................ 439/500 |
| 6,424,301 B1 | | 7/2002 | Johnson et al. ............ 343/702 |
| 6,722,916 B2 | * | 4/2004 | Buccinna et al. .......... 439/500 |
| 2002/0114992 A1 | | 8/2002 | Kwan et al. |
| 2004/0137786 A1 | * | 7/2004 | Yu ............................. 439/500 |

FOREIGN PATENT DOCUMENTS

| | | |
|---|---|---|
| JP | 06223003 | 8/1994 |
| JP | 8-185843 | 7/1996 |

* cited by examiner

*Primary Examiner*—Chandrika Prasad
(74) *Attorney, Agent, or Firm*—Jianq Chyun IP Office

(57) ABSTRACT

A battery securing structure with setting-cleared elements for being integrally assembled and welded onto a main board is provided. The battery securing structure comprises al insulation body, a first elastic structure, a second elastic structure, and a plurality of setting-cleared elements. The insulation body has a battery engagement portion and a securing portion. The first elastic structure is disposed on the bottom of the battery engagement portion for being electrically connected to one electrode of the battery. In addition, the second elastic structure is disposed on lateral side of the battery engagement portion for being electrically connected to another electrode of the battery. Moreover, a plurality of the setting-cleared elements is disposed on the securing portion.

6 Claims, 3 Drawing Sheets

BATTERY-SECURING STRUCTURE WITH SETTING-CLEARED ELEMENTS

BACKGROUND OF THE INVENTION

1. Field of Invention

The present invention relates to a battery securing structure and particularly to a battery securing structure with setting-cleared elements.

2. Description of Related Art

In most main boards, a jumper for clearing the CMOS (Complementary Metal-Oxide Semiconductor) setting values is popularly disposed in order to facilitate a reset operation for users. Generally, the jumper attached with an operation instruction, is a 3-pin or 2-pin jumper and adjacent to the CMOS battery securing structure of the main board. When the users connect the jumper cap to 2-pins labeled "CLR_CMOS," various manual set parameters stored in the BIOS is restored to values preset prior to the delivery of the main board from a factory.

Moreover, pins of the CMOS battery securing structure on the main board and pins of the jumper are all in DIP pins that can be plugged into a main board and welded thereon. As the length of the pins is too long, the assemblers nay contact the two "CLR_CMOS" pins by a mistake, thereby causing a short circuit and further degrading perforce of the assembly. Meanwhile, the jumper is adjacent to the battery securing structure, but they are two separately-assembled independent structures and cannot be assembled integrally, thus causing inconvenience to the assemblers and increasing the assembly time.

SUMMARY OF THE INVENTION

Accordingly, an object of the present invention is to provide a battery securing structure with setting-cleared elements, which can be integrally assembled and welded on a main board.

The present invention provides a battery securing structure with setting-cleared elements, which comprises an insulation body, a first elastic structure, a second elastic structure, and a plurality of setting clear elements. The insulation body is provided with a battery engagement portion and a securing portion. The first elastic structure is disposed on the bottom of the battery engagement portion for being electrically connected to lateral electrode of a battery. Moreover, the second elastic structure is disposed on lateral side of the battery engagement portion for being electrically connected to another electrode of the battery. In addition, a plurality of setting-cleared elements is disposed on the securing portion.

In order to the make the aforementioned and other objects, features and advantages of the present invention comprehensible, a preferred embodiment accompanied with figures is described in detail as below.

DESCRIPTION OF EMBODIMENTS

Figure 1:
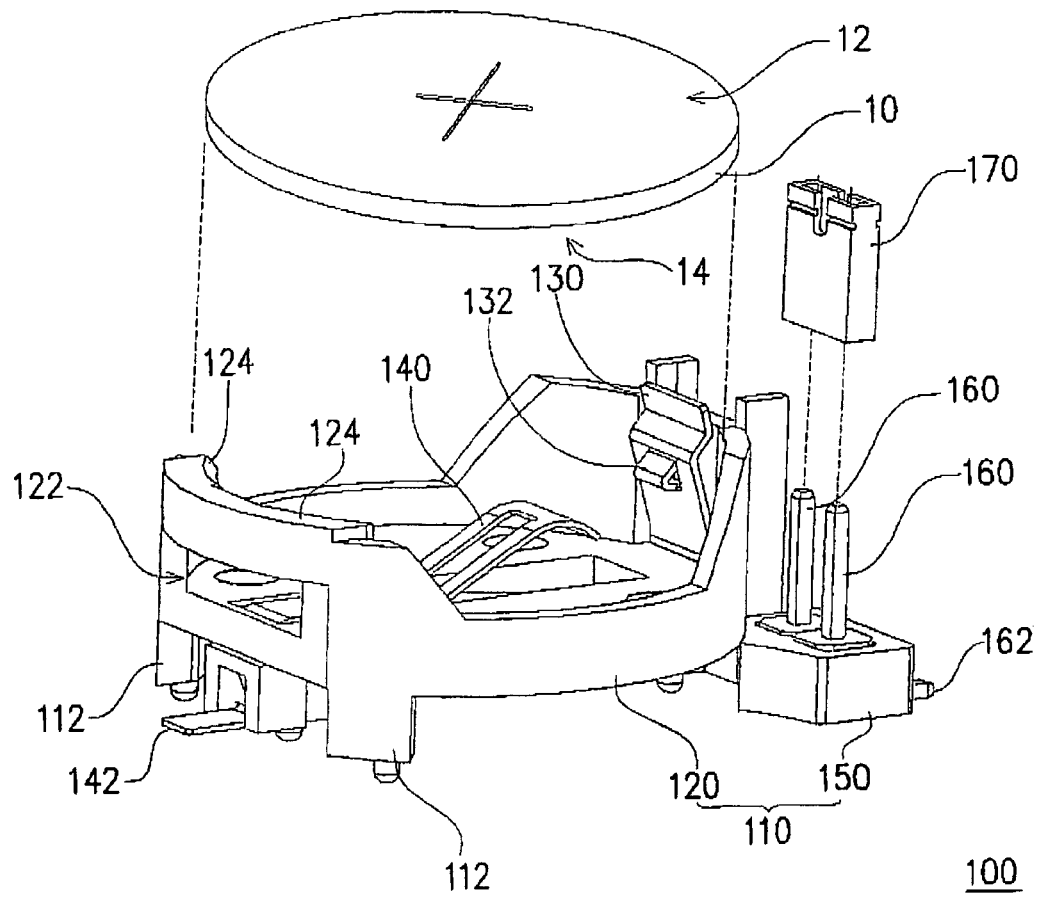
FIG. 1 depicts a schematic stereogram of an electrode and a battery securing structure with setting-cleared elements according to lateral preferred embodiment of the present invention.
Figure 2:
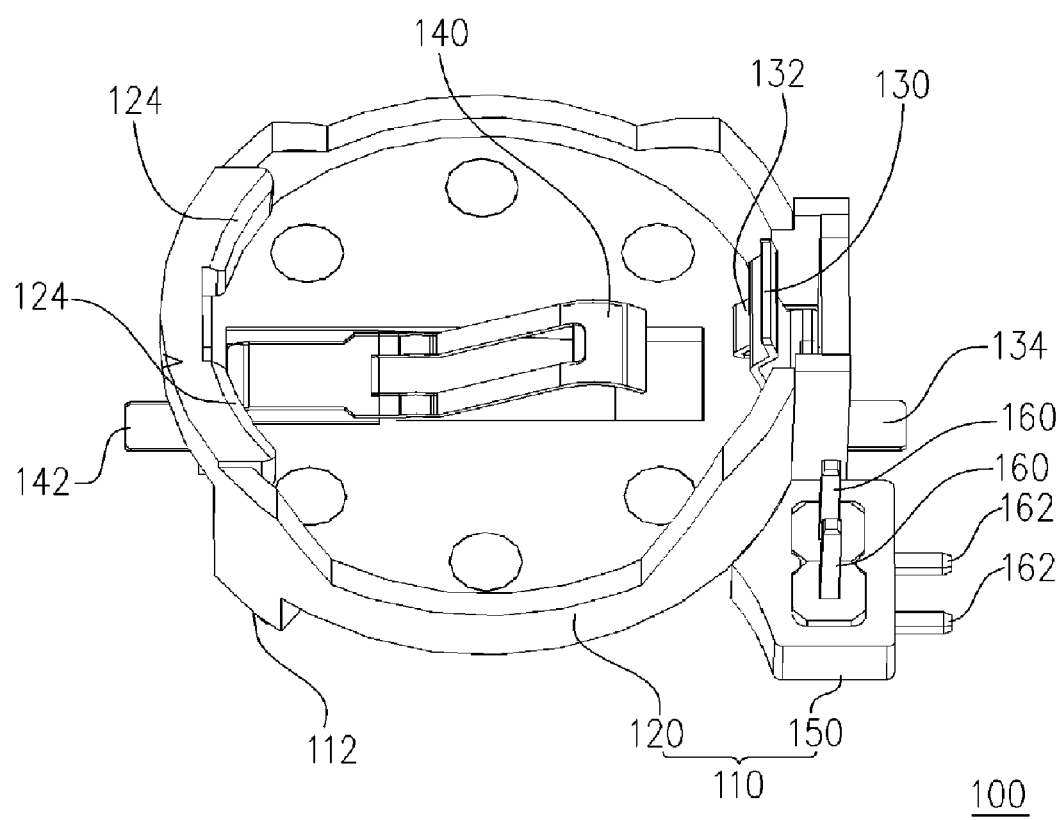
FIG. 2 depicts a top view of the battery securing structure with setting-cleared elements in FIG. 1.

FIG. 1 depicts a schematic stereogram of a battery and a battery securing structure with setting-cleared elements according to the preferred embodiment of the present invention. FIG. 2 depicts a top view of the battery securing structure with the setting-cleared elements in FIG. 1, and FIG. 3 depicts a bottom view of the battery-secured securing structure with the setting-cleared elements in FIG. 1.

Referring to FIG. 1, the battery securing structure 100 with the setting-cleared elements generally comprise an insulation body 110 made of plastics or insulating materials through injection molding for securing a button lithium battery 10 into a battery engagement portion 120 of the insulation body 110. The battery engagement portion 120 secures one end of the battery 10 by using a socket 122 and a pair of hooks 124 disposed above the socket. Then, the user pushes another end of the battery 10 downwardly into the battery engagement portion 120 to engage it under all embedment portion 132 of an elastic structure 130. When taking out the battery 10, the user only pulls the elastic structure 130 outwardly to allow the embedment portion 132 to be released from the battery 10.

Figure 3:
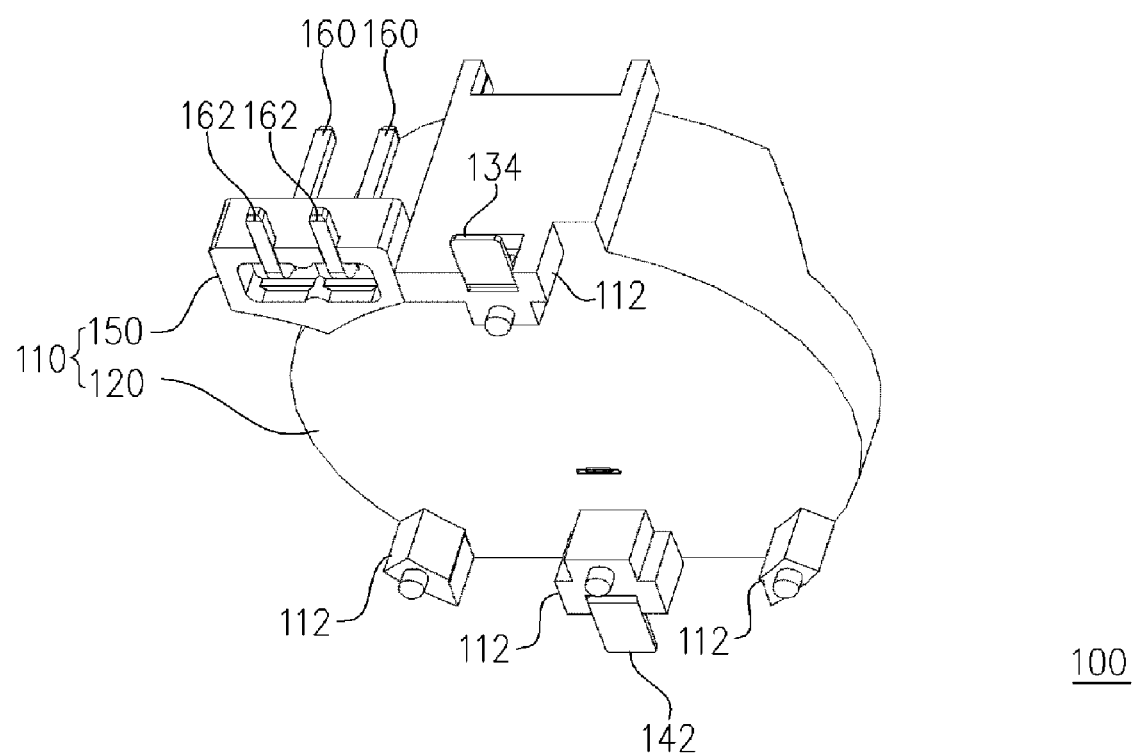
FIG. 3 depicts a bottom view of the battery securing structure with setting-cleared elements in FIG. 1.

Moreover, the above elastic structure 130 is a metal spring blade with the top thereof exposed at the lateral side of the battery engagement portion 120, such that during the engagement of the battery 10, the embedment portion 132 is electrically connected to the electrode 12 of the battery 10 and the lower end of the metal spring blade extends out of the bottom of the insulation body 110 after being bended (as shown in FIG. 3). Therefore, an end 134 of the metal spring blade can be welded on a circuit board (not shown) through Surface Mounting Technology (SMT) for conducting the electric power required by the CMOS of the circuit board.

As shown in FIG. 1, another elastic structure 140 is also a metal spring blade with the top thereof exposed at the bottom of the battery engagement portion 120, such that during the engagement of the battery 10, the another electrode 14 of the battery 10 can be electrically connected and the lower end of the metal spring blade also extends out of the bottom of the insulation body 110 after being bended. Therefore, an end 142 of the metal spring blade can also be flatly welded on a circuit board for conducting the electric power required by the CMOS of the circuit board.

It should be noted that the insulation body 110 of the present invention further comprises a securing portion 150 integrally formed with the battery engagement portion 120, for securing two or more setting-cleared elements 160. The setting-cleared elements 160 are metal pins with ends 162 flatly welded on the circuit board respectively after being beaded (as shown in FIG. 3). When the two pins are conducted with the jumper cap or a metal piece (not shown) by the user, the operation of clearing the CMOS setting values is carried out, and thus various manual set parameters stored in the BIOS (Basic Input/Output System) is restored to values preset prior to the delivery of the main board from a factory. The reference number 170 denotes the jumper cap.

It can be known from the above illustration that two elastic structures 130, 140 and the a plurality of setting-cleared elements 160 can be flatly welded on the circuit board after being bended, thus avoiding the drawback of incorrectly connection of the conventional DIP pins due to their long length. Moreover, a single securing structure formed by attaching the setting-cleared elements 160 to the insulation body 110 of the battery securing structure saves space and further eliminates the inconvenience of assembling the jumper and the battery securing structure respectively, whereby the assembler can rapidly complete the assembly to save the considerable assembling time.

Referring to FIG. 1 and FIG. 3, the insulation body 110 can adopt an elevated structure with the plurality of fixing pin 112 such that the battery engagement portion 120 can be higher than the attached securing portion 150, facilitating the positioning and welding carried out by the assembler. However, the present invention is not limited to the shape and size of the insulation body 110.

Although the present invention is disclosed with preferred embodiments as above, it is not used to limit the present invention, and any one skilled in the art can make modifications and retouches without departing from the spirit and range of the present invention. Therefore, the contents of the present invention under protection depend on the following claims.

What is claimed is:

1. A battery securing structure with setting-cleared elements for mounting on a circuit board, comprising:
   an insulation body, comprising a battery engagement portion and a securing portion connected thereto;
   a first elastic structure, disposed on the bottom of the battery engagement portion for being electrically connected to one electrode of a battery;
   a second elastic structure, disposed at the lateral side of the battery engagement portion for being electrically connected to another electrode of the battery; and
   a plurality of setting-cleared elements, disposed on the securing portion.

2. The battery securing structure with setting-cleared elements as claimed in claim 1, wherein the setting-cleared elements are conducted to each other for clearing set values of a CMOS (Complementary Metal-Oxide Semiconductor).

3. The battery securing structure with setting-cleared elements as claimed in claim 1, wherein the first elastic structure is a metal spring blade and its end can be welded on the circuit board.

4. The battery securing structure with setting-cleared elements as claimed in claim 1, wherein the second elastic structure is a metal spring blade and its end can be welded on the circuit board.

5. The battery securing structure with setting-cleared elements as claimed in claim 1, wherein the setting clear elements are pins and their end can be welded on the circuit board.

6. The battery securing structure with setting-cleared elements as claimed in claim 1, wherein the insulation body further has a plurality of securing pins disposed under the battery engagement portion.

* * * * *